United States Patent
Lee

(10) Patent No.: US 9,583,503 B1
(45) Date of Patent: Feb. 28, 2017

(54) THREE-DIMENSIONAL SEMICONDUCTOR DEVICE AND METHOD OF MANUFACTURING THE SAME

(71) Applicant: MACRONIX INTERNATIONAL CO., LTD., Hsinchu (TW)

(72) Inventor: Guan-Ru Lee, Kaohsiung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/966,173

(22) Filed: Dec. 11, 2015

(51) Int. Cl.
| H01L 27/115 | (2006.01) |
| H01L 23/528 | (2006.01) |
| H01L 21/3205 | (2006.01) |
| H01L 21/768 | (2006.01) |
| H01L 27/06 | (2006.01) |
| H01L 21/822 | (2006.01) |

(52) U.S. Cl.
CPC .. H01L 27/11578 (2013.01); H01L 21/32055 (2013.01); H01L 21/76877 (2013.01); H01L 21/76886 (2013.01); H01L 21/8221 (2013.01); H01L 23/528 (2013.01); H01L 27/0688 (2013.01); H01L 27/11551 (2013.01); H01L 27/11582 (2013.01)

(58) Field of Classification Search
CPC ............. H01L 21/8221; H01L 27/0688; H01L 27/11521; H01L 27/11524; H01L 27/11551; H01L 27/11556; H01L 27/11568; H01L 27/1157; H01L 27/11578
See application file for complete search history.

(56) References Cited

U.S. PATENT DOCUMENTS

| 7,821,057 B2* | 10/2010 | Ishihara | H01L 27/115 257/314 |
| 7,852,676 B2* | 12/2010 | Maejima | G11C 5/02 365/185.11 |
| 2007/0252201 A1* | 11/2007 | Kito | H01L 21/8221 257/331 |
| 2008/0067583 A1* | 3/2008 | Kidoh | H01L 21/8221 257/326 |
| 2009/0267128 A1* | 10/2009 | Maejima | H01L 27/11565 257/314 |
| 2010/0006922 A1* | 1/2010 | Matsuoka | G11C 16/0483 257/324 |
| 2010/0019310 A1* | 1/2010 | Sakamoto | H01L 27/11578 257/324 |

* cited by examiner

*Primary Examiner* — Eduardo A Rodela
(74) *Attorney, Agent, or Firm* — McClure, Qualey & Rodack, LLP

(57) ABSTRACT

A three-dimensional semiconductor device is provided, comprising: a plurality of ground selection line (GSL) sections separately formed on a substrate, the GSL sections being electrically insulated from each other and extended in parallel to each other, and the GSL sections extending along a first direction; a plurality of stacked structures vertically formed on the GSL sections on the substrate, and each stacked structure comprising alternated semiconductor layers and insulating layers; string selection lines (SSLs) separately formed on the stacked structures, and the string selection lines extending along the first direction; and bit lines disposed above the SSLs and extending along a second direction, the bit lines arranged parallel to each other and in perpendicular to the SSLs and GSL sections, wherein a plurality of memory cells of memory layers respectively defined by the stacked structures, the SSLs, the GSL sections and the bit lines correspondingly.

20 Claims, 20 Drawing Sheets

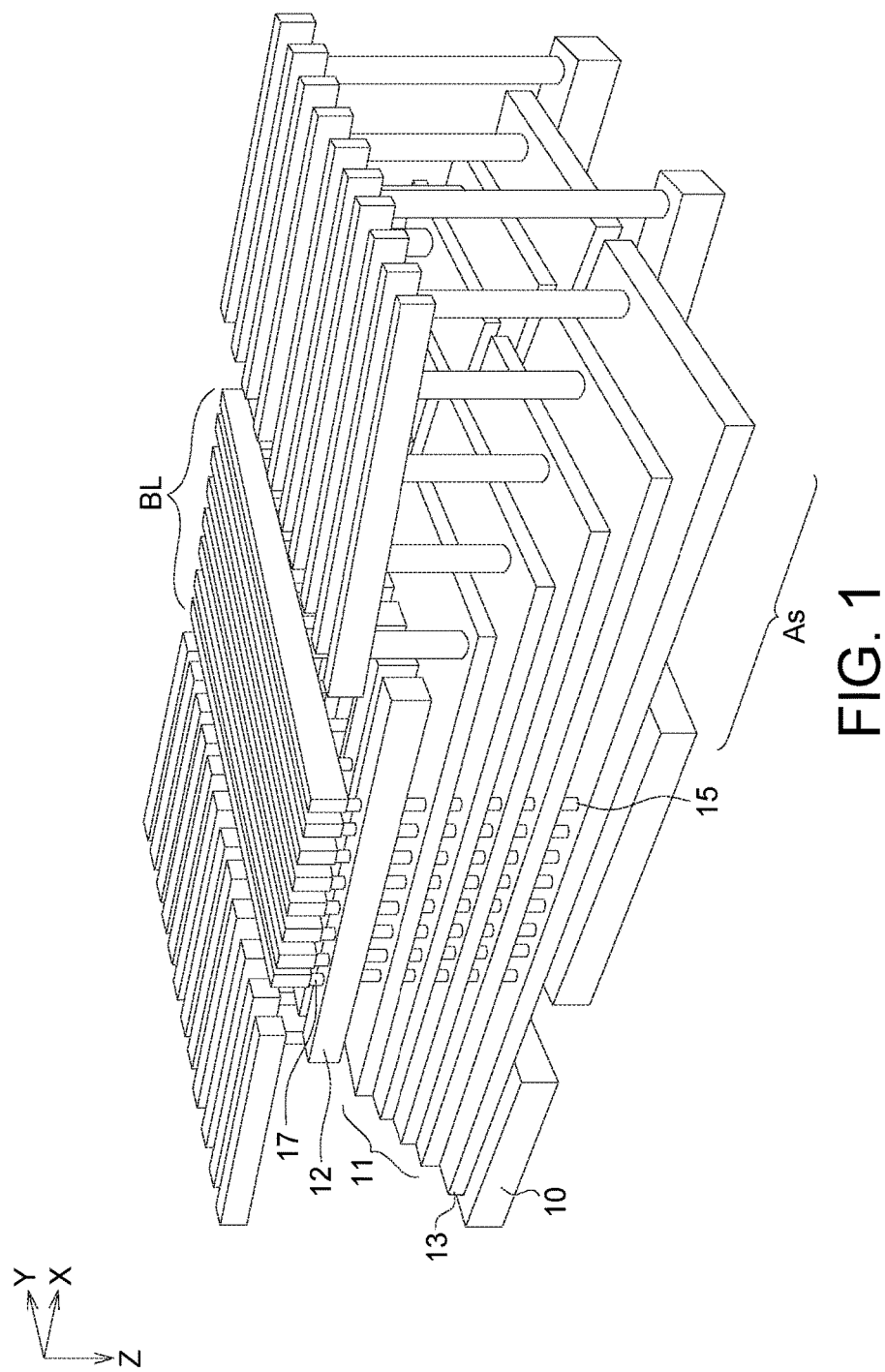

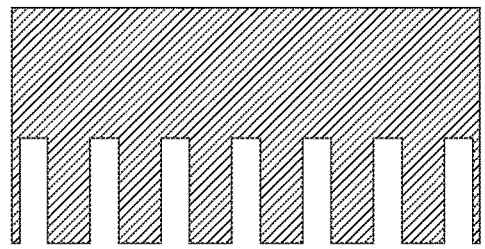
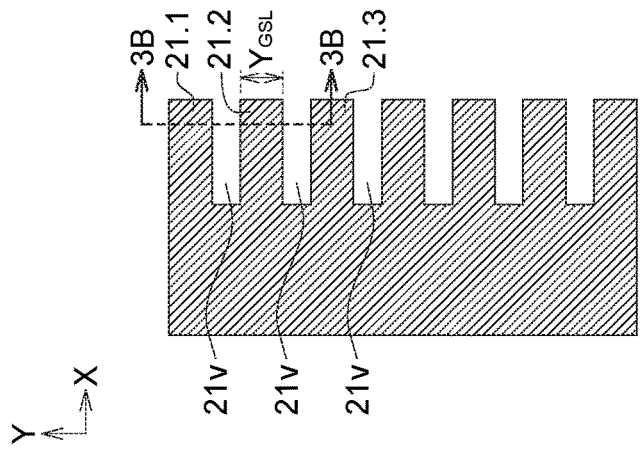
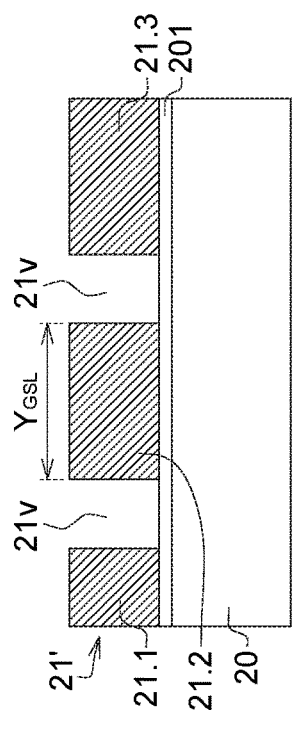
FIG. 3A
FIG. 3B

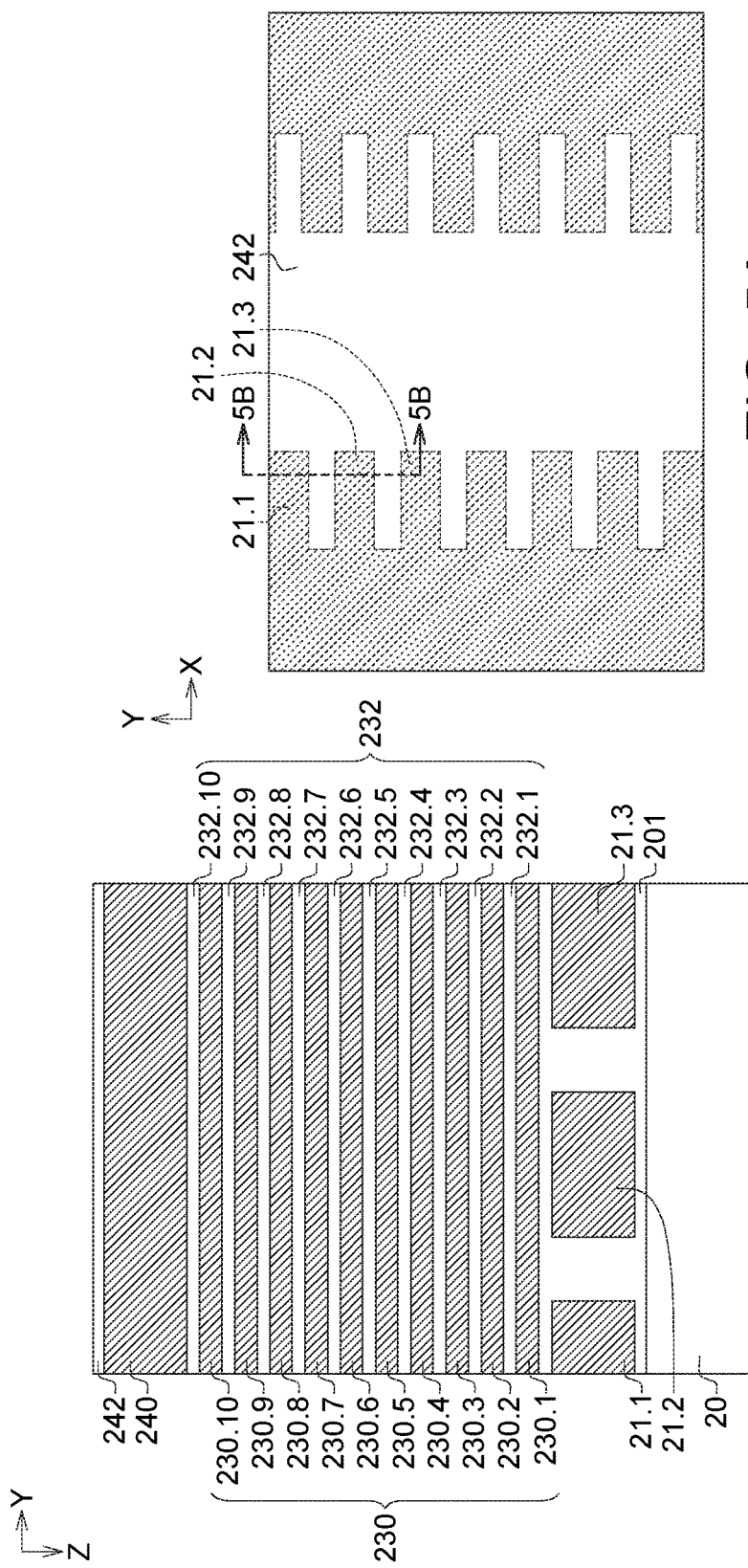

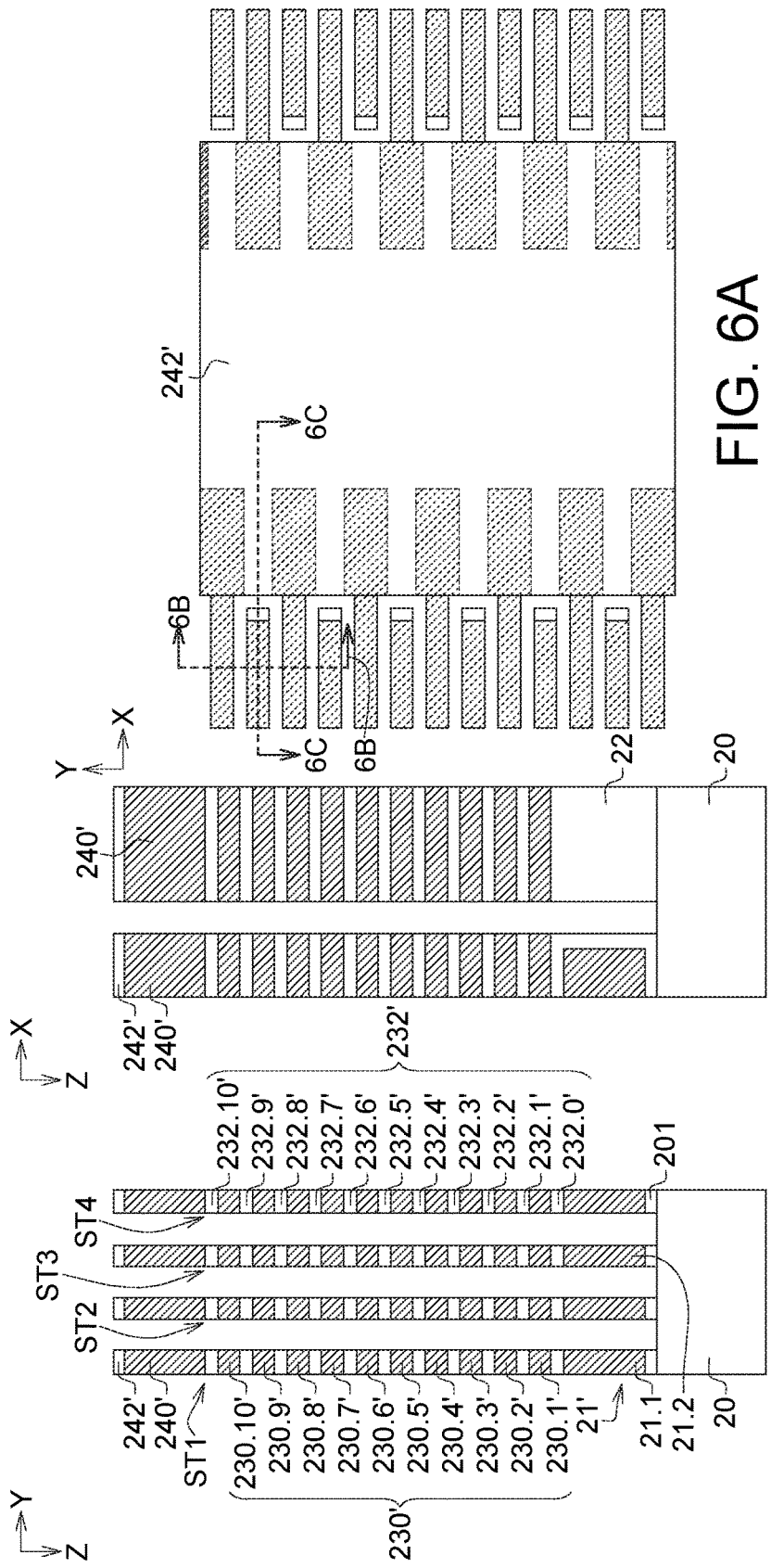

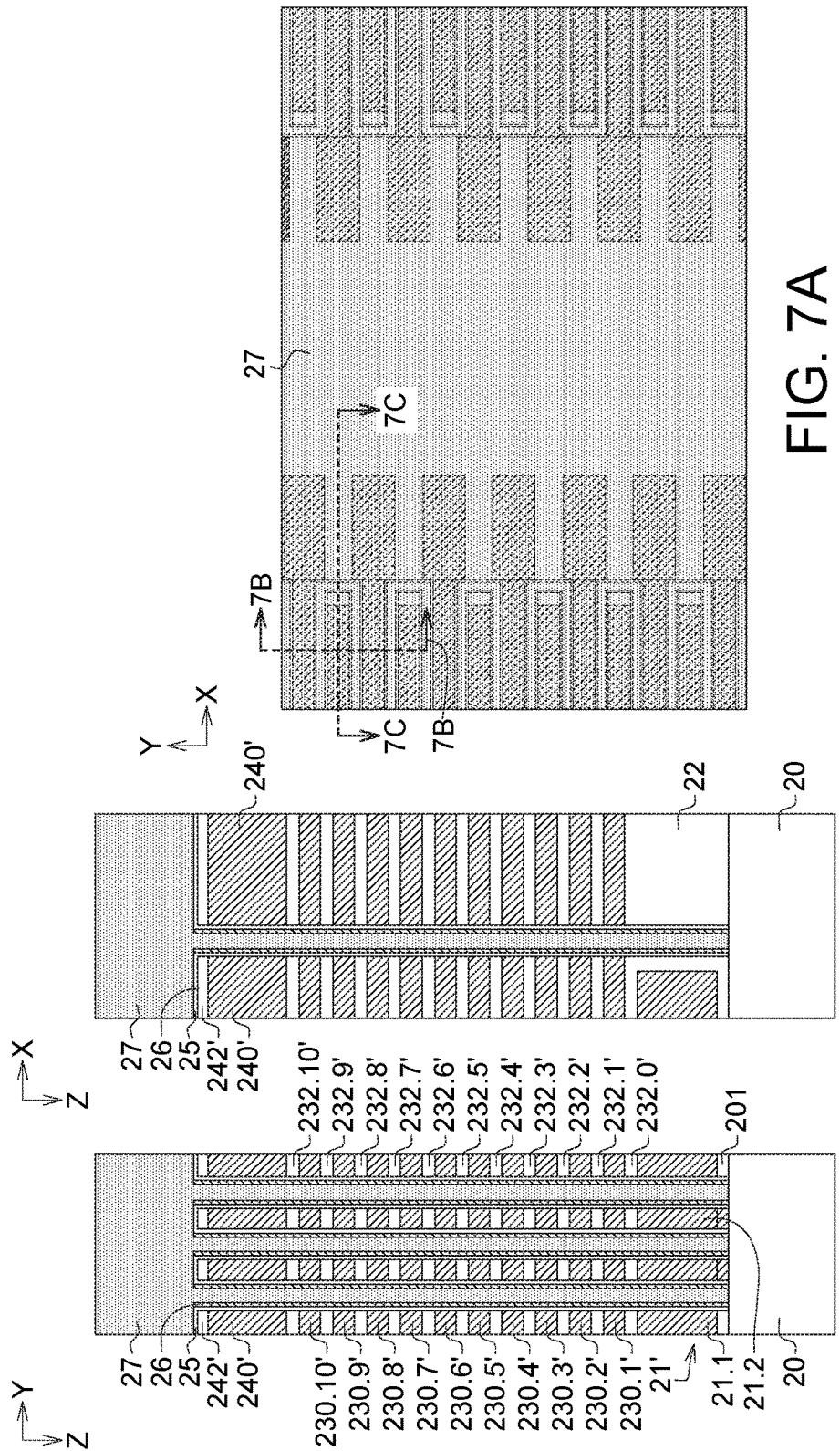

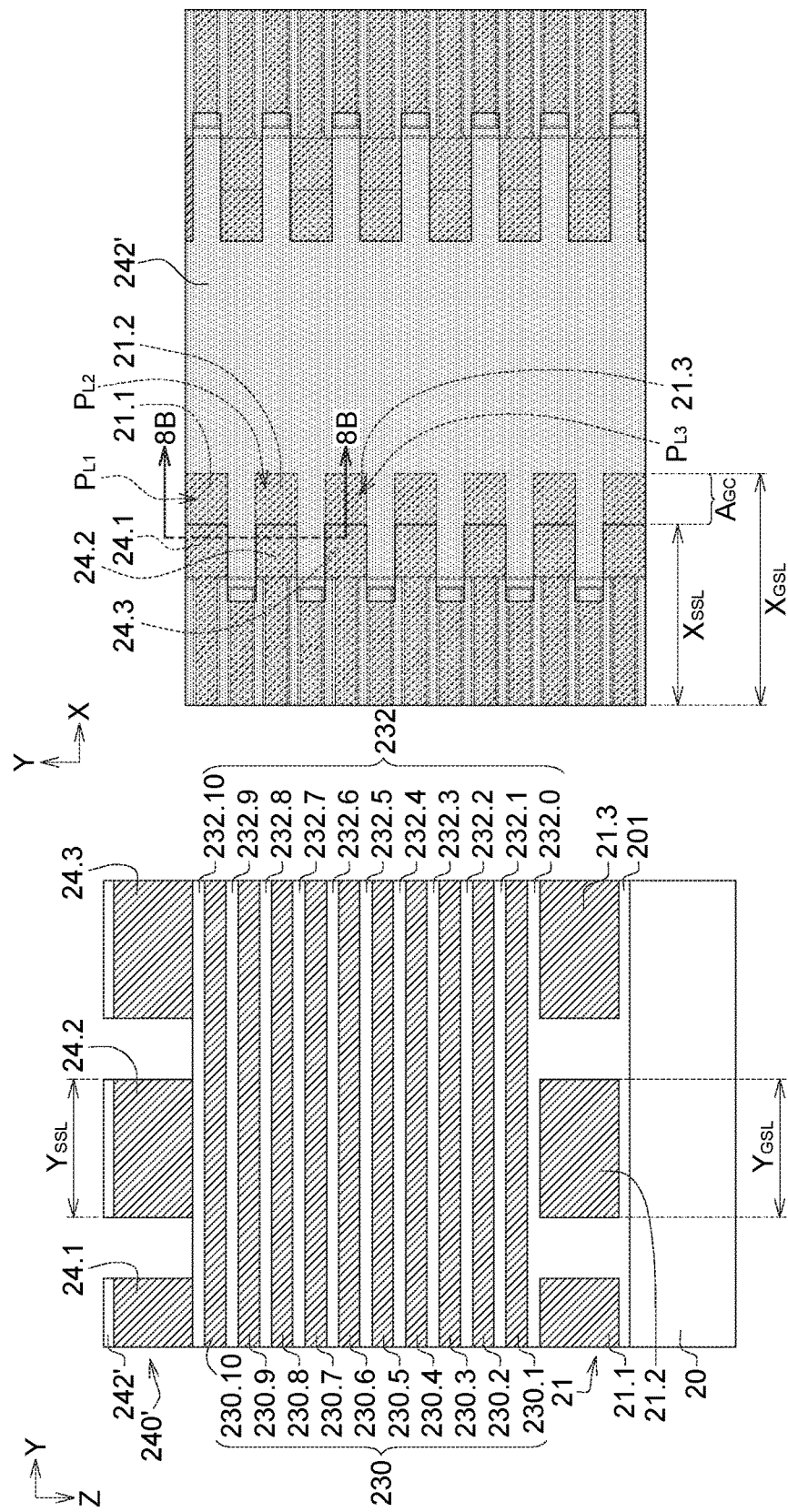

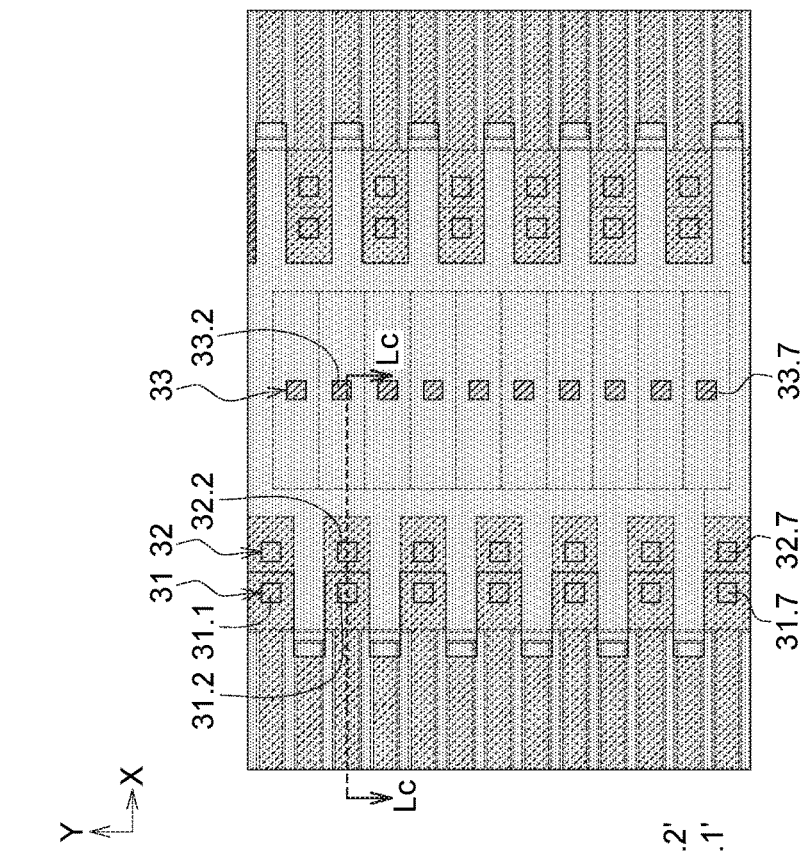
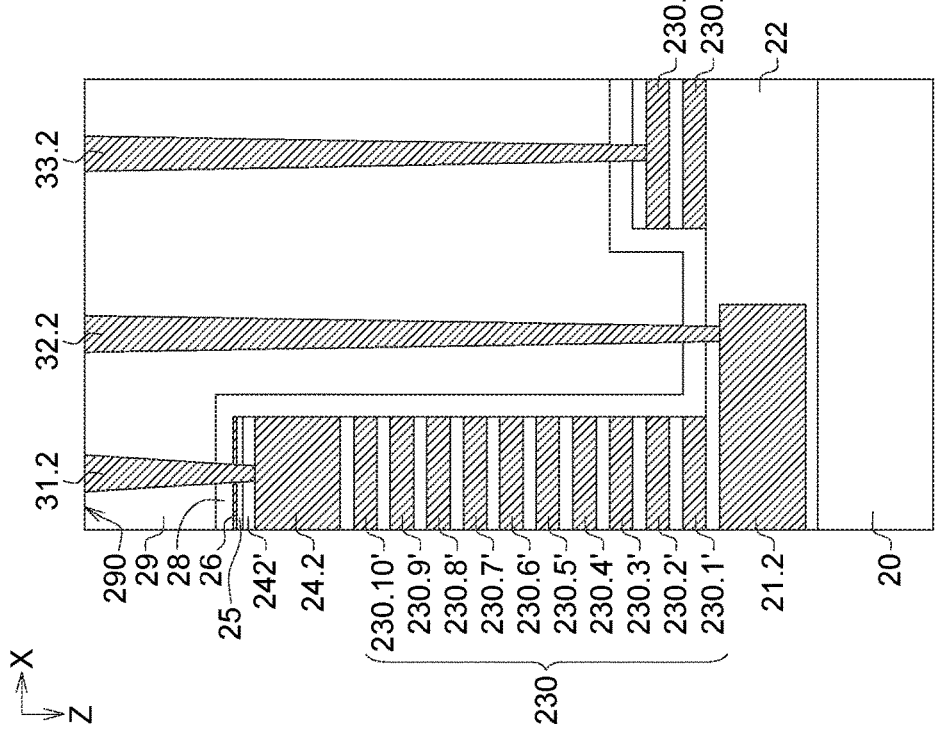
FIG. 10A
FIG. 10B

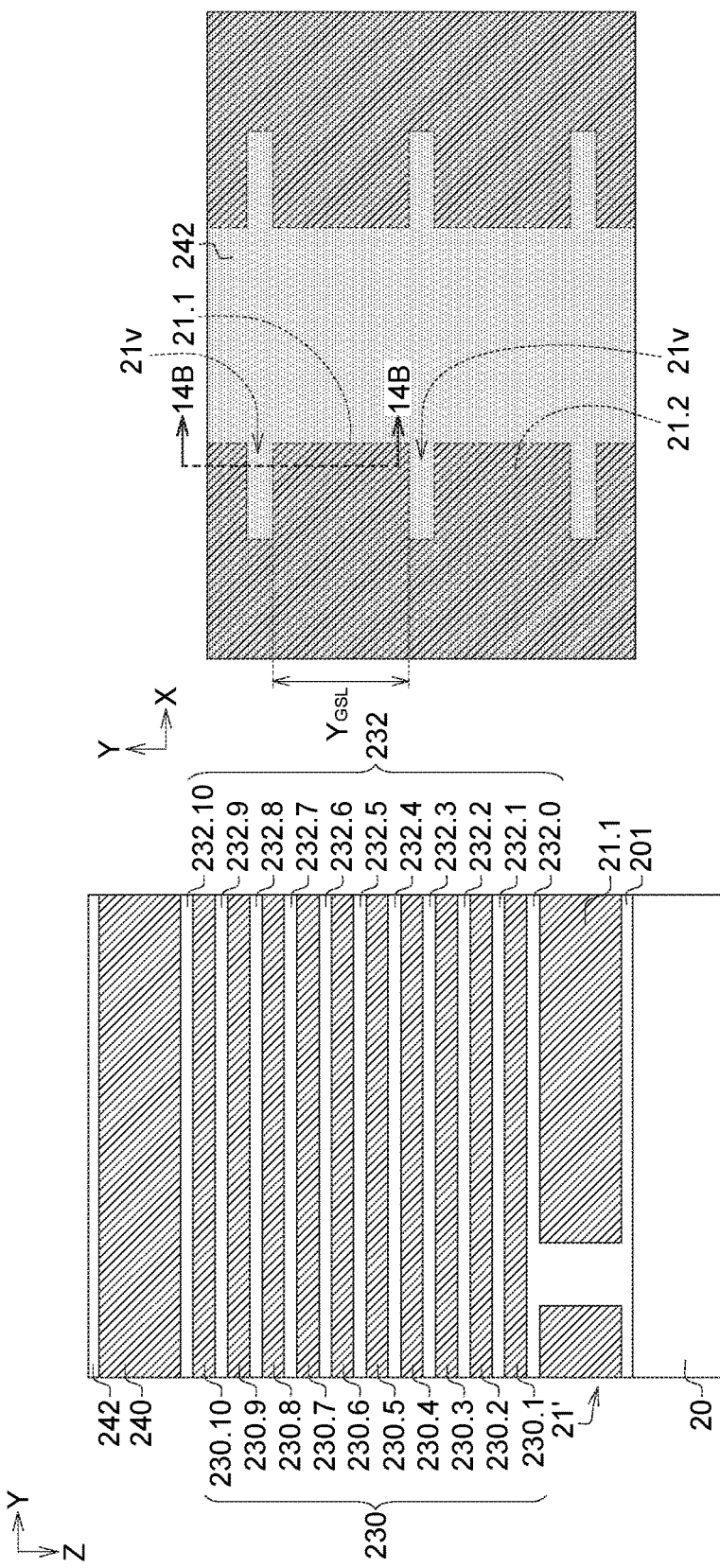

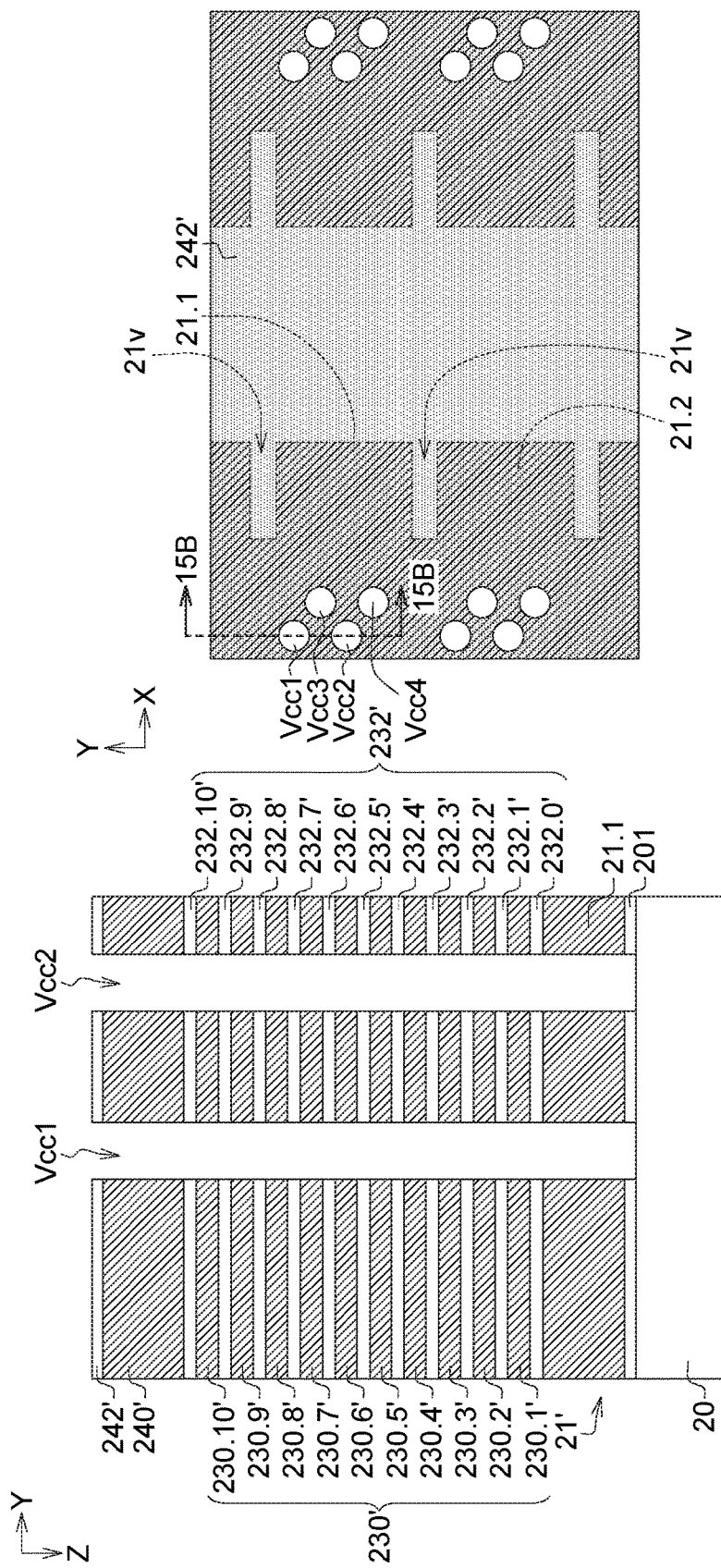

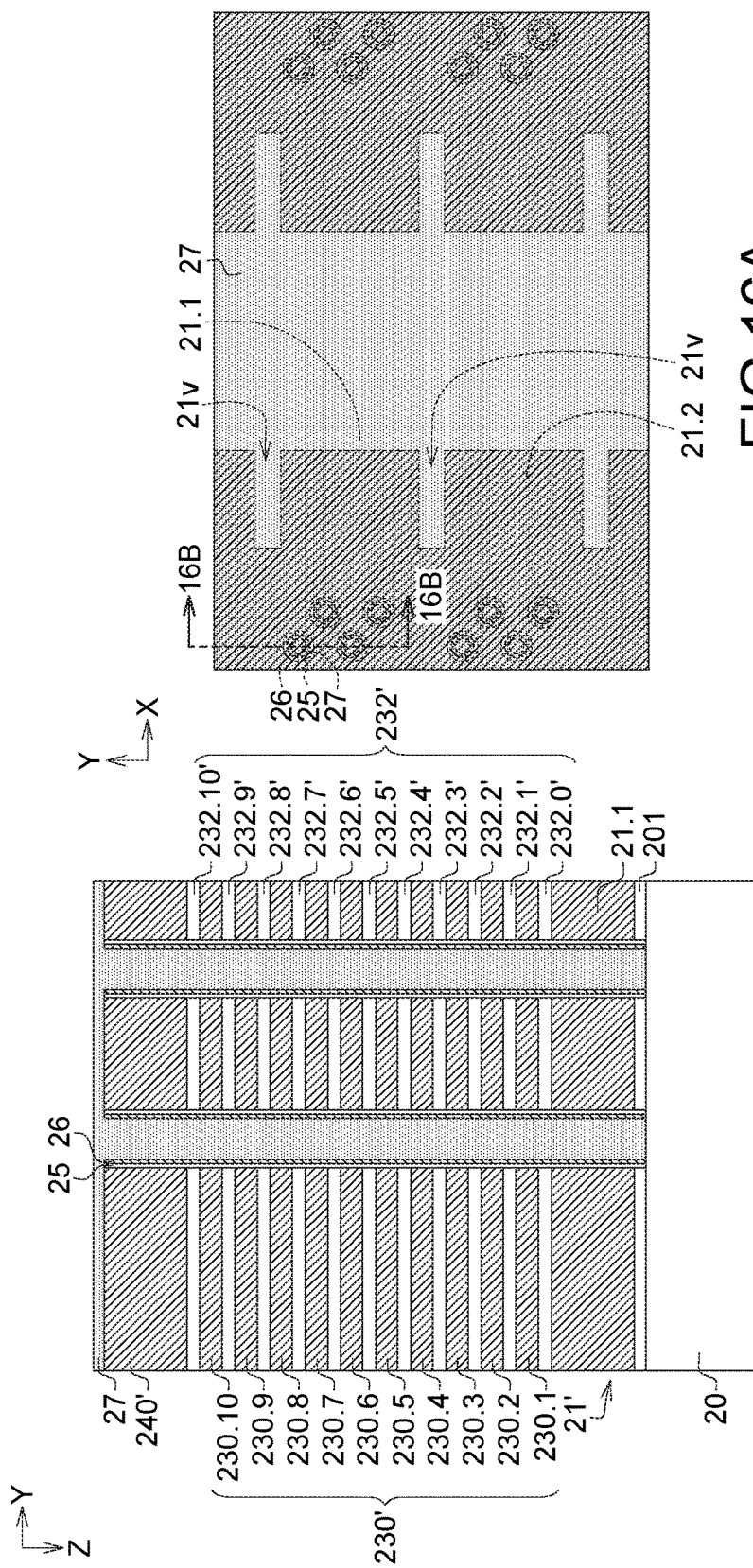

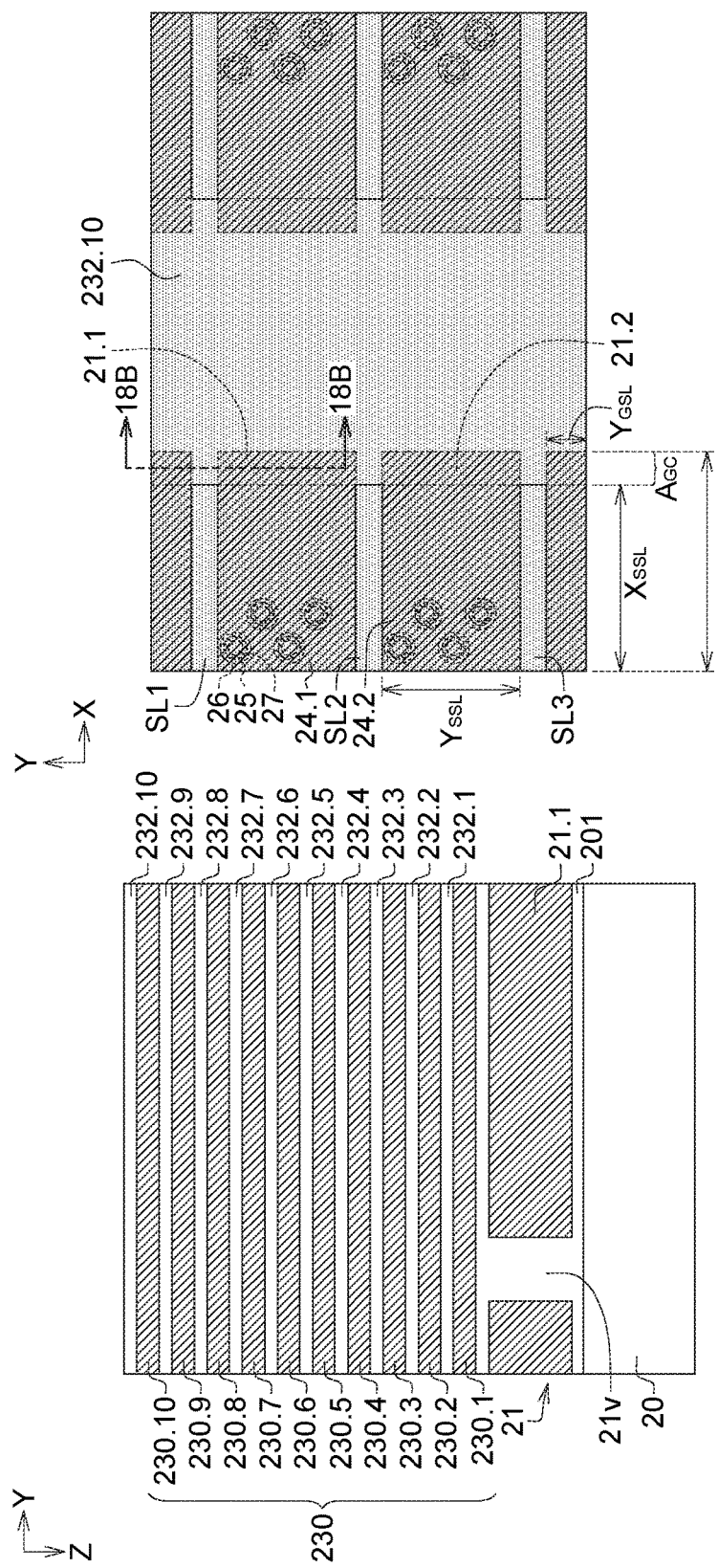

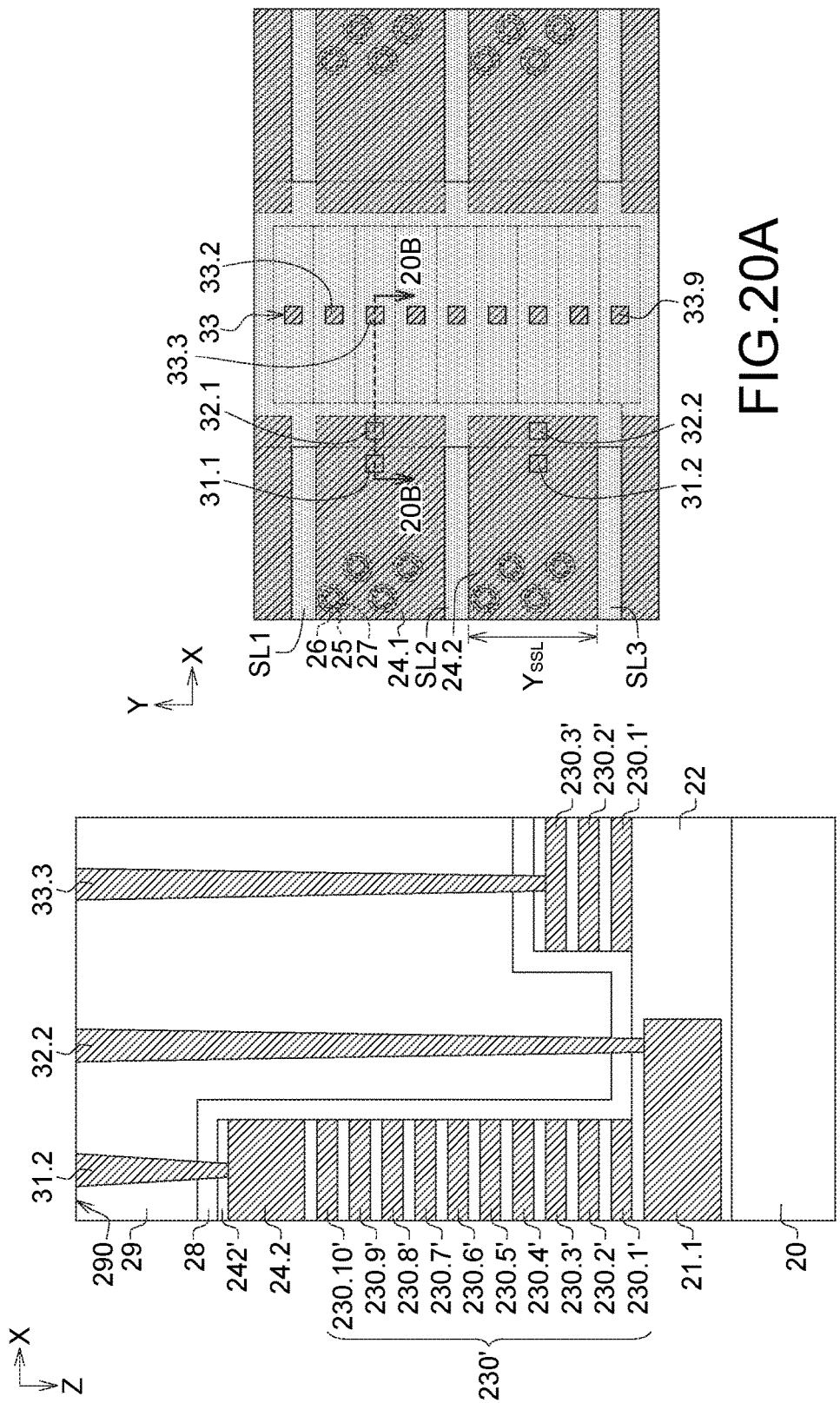

THREE-DIMENSIONAL SEMICONDUCTOR DEVICE AND METHOD OF MANUFACTURING THE SAME

BACKGROUND

Field of the Invention

The disclosure relates in general to a three-dimensional (3D) semiconductor device and method of manufacturing the same, and more particularly to a vertical channel (VC) type 3D semiconductor device and method of manufacturing the same.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure not only with larger number of multiple planes being stacked to achieve greater storage capacity, but also with memory cells having excellent electrical properties (such as reliability of data storage and speed of operation), so that the memory cells can be erased and programmed effectively. Typically, NAND Flash page size is proportional to the number of the bit lines (BL). Accordingly, when the semiconductor device is scaled down, not only the decreased cost but also the increased read/write data rate are achieved due to the increasing of parallel operation, which leads to higher data rate. However, the conventional semiconductor device usually suffers from reading disturbance that is one of critical factor which affects device window and performance.

SUMMARY

The disclosure relates to a three-dimensional (3D) semiconductor device and method of manufacturing the same. According to the embodied structures of the 3D semiconductor devices, the reading disturbance during operation can be reduced.

According to the present disclosure, a three-dimensional (3D) semiconductor device is provided, comprising: a plurality of ground selection line (GSL) sections separately formed on a substrate, the GSL sections being electrically insulated from each other and extended in parallel to each other, and the GSL sections extending along a first direction; a plurality of stacked structures vertically formed on the GSL sections on the substrate, and each stacked structure comprising alternated semiconductor layers and insulating layers; a plurality of string selection lines (SSLs) separately formed on the stacked structures, and the string selection lines extending along the first direction; and a plurality of bit lines disposed above the SSLs and extending along a second direction, the bit lines arranged parallel to each other and in perpendicular to the SSLs and GSL sections, wherein a plurality of memory cells of memory layers respectively defined by the stacked structures, the SSLs, the GSL sections and the bit lines correspondingly.

According to the present disclosure, a three-dimensional (3D) semiconductor device is provided, comprising: providing a substrate with an insulating surface; forming a first semiconductor layer on the insulating surface of the substrate; patterning the first semiconductor layer to form a plurality of ground selection line (GSL) sections separately on the substrate, wherein the GSL sections are electrically insulated from each other and extend along a first direction; forming a plurality of stacked structures vertically on the GSL sections on the substrate and a plurality of string selection lines (SSLs) separately formed on the stacked structures, wherein each stacked structure comprises alternated second semiconductor layers and insulating layers, and the string selection lines extend along the first direction; and forming a plurality of bit lines above the SSLs and extending along a second direction, the bit lines arranged parallel to each other and in perpendicular to the SSLs and GSL sections, wherein a plurality of memory cells respectively defined by the stacked structures, the SSLs, the GSL sections and the bit lines correspondingly.

The disclosure will become apparent from the following detailed description of the preferred but non-limiting embodiments. The following description is made with reference to the accompanying drawings.

BRIEF DESCRIPTION OF THE DRAWINGS

FIG. 1 is a simples drawing of a 3D semiconductor device.

FIG. 2A-FIG. 10B Illustrate a method for manufacturing a 3D semiconductor device according to the first embodiment of the disclosure.

FIG. 11A-FIG. 20B Illustrate a method for manufacturing a 3D semiconductor device according to the second embodiment of the disclosure.

DETAILED DESCRIPTION

Figure 2A:
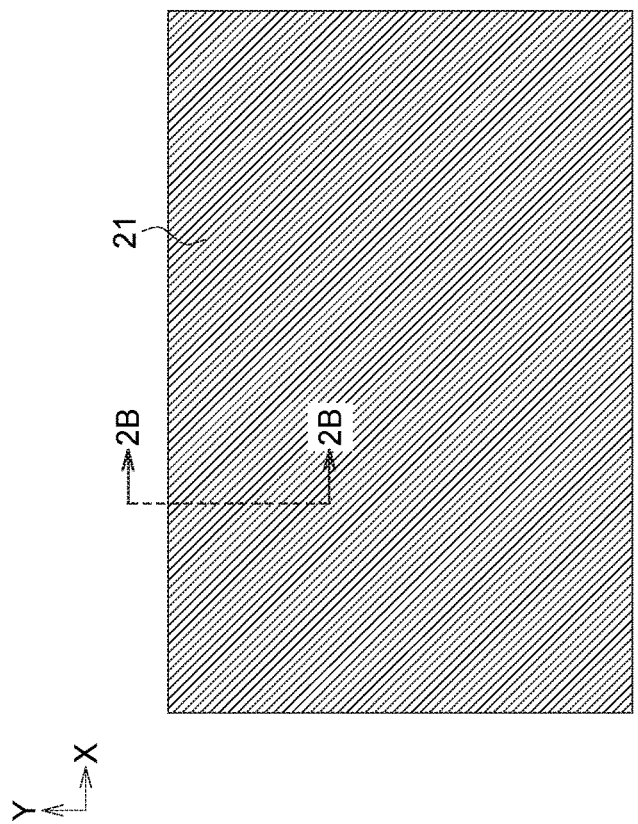

The embodiments of the present disclosure disclosed below are for elaborating a three-dimensional (3D) semiconductor device, such as vertical-channel (VC) type 3D semiconductor devices, and the method of manufacturing the same. According to the 3D semiconductor devices of the embodiments, the reading disturbance between the memory pages can be efficiently suppressed, thereby significantly improving the performance of the 3D semiconductor device during operation.

The disclosure can be applied to various applications with different cell arrays of 3D semiconductor devices, such as a vertical-channel (VC) type 3D semiconductor device. FIG. 1 is a simples drawing of a 3D semiconductor device, for illustrating the general scheme of a VC type 3D semiconductor device. A VC type 3D semiconductor device comprises a plurality of memory layers 11 (comprising control gates) vertically stacked on a substrate 10 and parallel to each other; a plurality of string selection lines (SSLs) 12 disposed on the memory layers and parallel to each other; a plurality of stacked structures (also known as strings) 15 formed vertically to the memory layers 11 and the SSLs 12. The stacked structures 15 are electrically connected to the corresponding SSLs 12. Also, the 3D semiconductor device comprises a plurality of bit lines BLs disposed on the SSLs 12, and the bit lines BLs are arranged in parallel to each other and in perpendicular to the SSLs 12. A plurality of memory cells of the memory layers 11 are respectively defined by the stacked structures 15, the SSLs 12 and the bit lines BLs correspondingly. The memory cells of each memory page can be read or write at the same time. Also, a ground select line (GSL) 13 is further formed under the memory layers 11 (and typically uncut or in the form of a continuous layer with large area). The 3D semiconductor device may comprise other known elements; for example, a plurality of string contacts 17 are formed vertically to the memory layers 11 and electrically connected to the corresponding SSLs 12, and each of the string contacts 17 is disposed correspondingly at each of the stacked structures 15 of the cells, wherein the string contacts 17 can be electrically connected to the corresponding bit lines BLs by a patterned metal layer and a plurality of conductive vias. Also, the 3D semiconductor device has a stairstep landing area $A_S$ with several pad structures (ex: word line pad structures) arranged layer by layer, wherein those pad structures are coupled to the memory cells of the corresponding memory layers 11.

During operation of the typical VC type 3D semiconductor device (as shown in FIG. 1), the performance of the device would be affected due to the reading disturbance. A new scheme of the 3D semiconductor device is provided in the disclosure for solving the issue of reading disturbance. Two of the applications, such as the single gate vertical channel (SGVC) 3D semiconductor device and gate-all-around vertical channel (GAAVC) 3D semiconductor device are exemplified below for illustrating the embodiments of the disclosure. However, the disclosure is not limited to those types of semiconductor device, and the detailed constructions disclosed in those embodiments of the disclosure are for illustration only, not for limiting the scope of protection of the disclosure.

Embodiments are provided hereinafter with reference to the accompanying drawings for describing the related configurations and procedures, but the present disclosure is not limited thereto. The identical and/or similar elements of the embodiments are designated with the same and/or similar reference numerals. Also, it is noted that there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

First Embodiment

FIG. 2A-FIG. 10B illustrate a method for manufacturing a 3D semiconductor device according to the first embodiment of the disclosure. In the first embodiment, the single gate vertical channel (SGVC) 3D semiconductor device is exemplified for illustration.

Figure 2B:
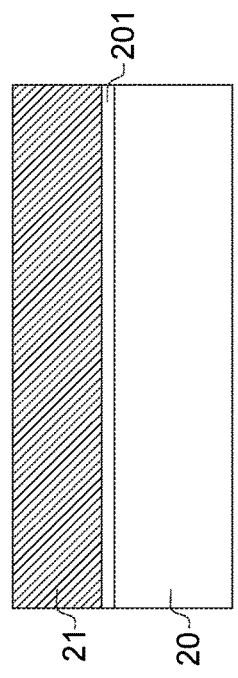

Please refer to FIG. 2A and FIG. 2B. FIG. 2A is a top view of a 3D semiconductor device according to the first embodiment of the present disclosure, which shows deposition of a GSL material layer. FIG. 2B is a cross-sectional view of the 3D semiconductor device along the cross-sectional line 2B-2B of FIG. 2A. Also, FIG. 2A and FIG. 2B show the 3D semiconductor device in a xy-plane and a yz-plane, respectively. As shown in FIG. 2B, a substrate 20 with an insulating surface is provided, and the insulating surface can be an insulation film 201 such as an oxide layer formed on the substrate 20. A first semiconductor layer (such as polysilicon layer) 21 is deposited on the insulating surface of the substrate 20.

Please refer to FIG. 3A and FIG. 3B. FIG. 3A is a top view of a 3D semiconductor device according to the first embodiment of the present disclosure, which shows pattern define of the GSL material layer. FIG. 3B is a cross-sectional view of the 3D semiconductor device along the cross-sectional line 3B-3B of FIG. 3A. Also, FIG. 3A and FIG. 3B show the 3D semiconductor device in a xy-plane and a zy-plane, respectively. As shown in FIG. 3A and FIG. 3B, the first semiconductor layer 21 are patterned (such as by photolithography and etching) to form a plurality of ground selection line (GSL) sections (such as GSL sections 21.1, 21.2 and 21.3) separately on the substrate 20, which means the GSL sections (such as GSL sections 21.1, 21.2 and 21.3) are electrically insulated from each other. The spaces 21v are formed between the adjacent GSL sections. Also, according to the embodiment, the GSL sections (such as GSL sections 21.1, 21.2 and 21.3) are extended along a first direction (i.e. X-direction), and a first transverse length $Y_{GSL}$ along a second direction (i.e. Y-direction) of each GSL section (ex: 21.1/21.2/21.3 . . . ) has been defined.

Figure 4A:
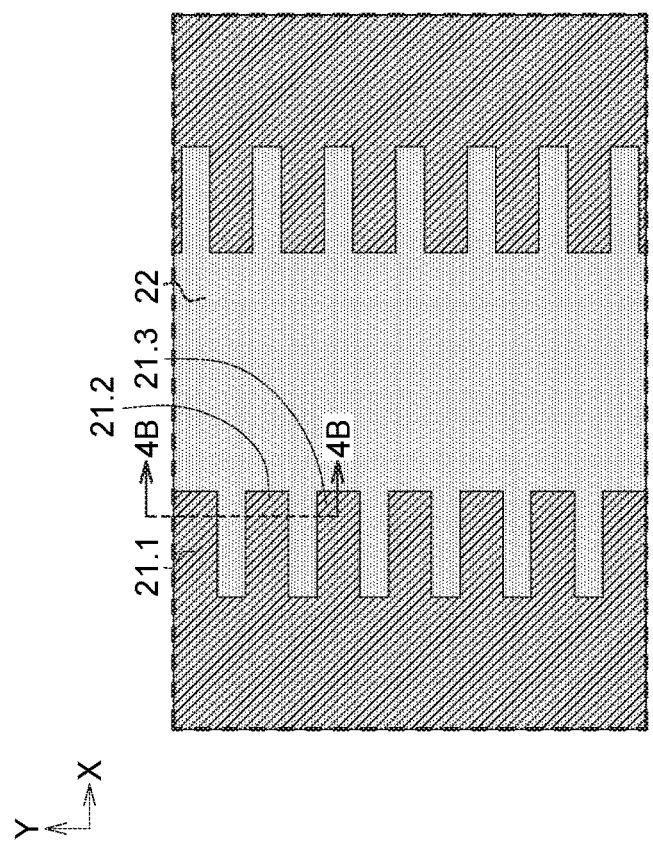
Figure 4B:
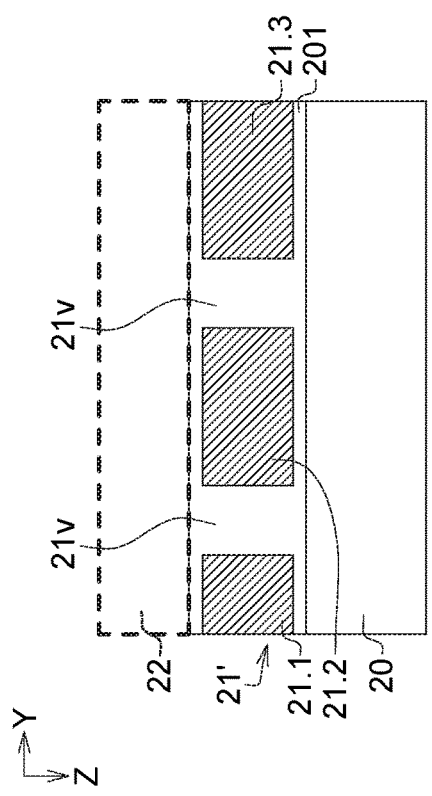

Please refer to FIG. 4A and FIG. 4B. FIG. 4A is a top view of a 3D semiconductor device (in a xy-plane) according to the first embodiment of the present disclosure, which shows insulation seal between the GSL sections. FIG. 4B is a cross-sectional view of the 3D semiconductor device (in a yz-plane) along the cross-sectional line 4B-4B of FIG. 4A. After forming the separate GSL sections, an insulating layer 22 is deposited on the GSL sections (ex: 21.1/21.2/21.3 . . . ) to fill the spaces 21v between the adjacent GSL sections, followed by planarization (such as chemical mechanical polishing, CMP). In one embodiment, the top surfaces of the GSL sections (ex: 21.1/21.2/21.3 . . . ) can be revealed after CMP, as shown in FIG. 4A. Also, the insulating layer 22 and the insulation film 201 can be made of the same material such as oxide, or any suitable materials.

Next, formation of the stacked structures vertically on the GSL sections on the substrate 20 and formation of the string selection lines (SSLs) separately on the stacked structures are conducted.

Please refer to FIG. 5A and FIG. 5B. FIG. 5A is a top view of a 3D semiconductor device (in a xy-plane) according to the first embodiment of the present disclosure, which shows perspective positions of the GSL sections after the multi-layers have been deposited. FIG. 5B is a cross-sectional view of the 3D semiconductor device (in a yz-plane) along the cross-sectional line 5B-5B of FIG. 5A. As shown in FIG. 5B, the alternated second semiconductor layers 230 (including 230.1 to 230.10), 240 and the insulating layers 232 (including 232.0 to 232.10) and 242 are deposited on the GSL sections.

Please refer to FIG. 6A and FIG. 6B. FIG. 6A is a top view of a 3D semiconductor device (in a xy-plane) according to the first embodiment of the present disclosure, which shows array pattern of the multi-layers. FIG. 6B is a cross-sectional view of the 3D semiconductor device (in a yz-plane) along the cross-sectional line 6B-6B of FIG. 6A. FIG. 6C is a cross-sectional view of the 3D semiconductor device (in a xz-plane) along the cross-sectional line 6C-6C of FIG. 6A. As shown in FIG. 6B and FIG. 6C, the second semiconductor layers 230 (including 230.1 to 230.10) and 240 are patterned to form the patterned second semiconductor layers 230' (including 230.1' to 230.10') and 240', while the insulating layers 232 (including 232.0 to 232.10) and 242 are patterned to form the patterned insulating layers 232' (including 232.0' to 232.10') and 242' in the array region. Accordingly, a plurality of stacked structures (such as ST1-ST4 as shown in FIG. 6B) are formed vertically on the pattern first semiconductor layers 20' (ex: GSL sections) on the substrate 20, and a plurality of string selection lines (SSLs) 240' are separately formed on the stacked structures, wherein each stacked structure comprises alternated the patterned second semiconductor layers 230' (acting as word lines in the vertical channel type semiconductor device) and the patterned insulating layers 232'. Also, the string selection lines 240' extend along the first direction (i.e. X-direction), as shown in FIG. 6A. The pattern procedure can be conducted by photolithography and etching.

FIG. 7A is a top view of a 3D semiconductor device (in a xy-plane) according to the first embodiment of the present disclosure, which shows ONO deposition and channel conductor deposition. FIG. 7B is a cross-sectional view of the 3D semiconductor device (in a yz-plane) along the cross-sectional line 7B-7B of FIG. 7A. FIG. 7C is a cross-sectional view of the 3D semiconductor device (in a xz-plane) along the cross-sectional line 7C-7C of FIG. 7A. As shown in FIG. 7B and FIG. 7C, formations of the ONO layers (as the charge trapping layer) 25 conformed with the stacked structures, the channel conductors 26 (such as polysilicon) formed at the sidewalls of the ONO layers 25, and a dielectric sealing are performed. The ONO layers 25 and the channel conductors 26 contact the substrate 20. Also, a dielectric layer 27 (such as oxide) is formed on the substrate 20 to seal the structures containing the ONO layers 25 and the channel conductors 26, followed by planarization (such as CMP). Other processes for manufacturing the memory cells in the array region are the same as typical SGVC flows, which are not described herein.

Please refer to FIG. 8A and FIG. 8B. FIG. 8A is a top view of a 3D semiconductor device (in a xy-plane) according to the first embodiment of the present disclosure, which shows perspective positions of the SSLs and GSL sections after SSL patterning procedure. FIG. 8B is a cross-sectional view of the 3D semiconductor device (in a yz-plane) along the cross-sectional line 8B-8B of FIG. 8A. After SSL patterning procedure (ex: photolithography and etching), the transverse lengths and the longitudinal lengths of the corresponding SSL (24.1/24.2/24.3 . . . ) and the GSL section (21.1/21.2/21.3 . . . ) are defined. As shown in FIG. 8A and FIG. 8B, one of the GSL sections (such as GSL section 21.2) in each of the memory pages has a first longitudinal length $X_{GSL}$ along the first direction (X-direction) and a first transverse length $Y_{GSL}$ along the second direction (Y-direction), and one of the SSLs (24.1/24.2/24.3 . . . ) has a second longitudinal length $X_{SSL}$ along the first direction (X-direction) and a second transverse length $Y_{SSL}$ along the second direction (Y-direction). According to the embodiment, the first longitudinal length $X_{GSL}$ is greater than the second longitudinal length $X_{SSL}$, so as to create a landing platform ($P_{L1}$, $P_{L2}$, $P_{L3}$, . . . in FIG. 8A) corresponding to each pair of the SSL and the GSL section within a GSL contact region $A_{GC}$. Also, in one embodiment, the first transverse length $Y_{GSL}$ is (but not limited to) substantially equal to the second transverse length $Y_{SSL}$. Also, in one embodiment, the first transverse length $Y_{GSL}$ of the GSL section is corresponding to a transverse length of the related memory page.

Figure 9A:
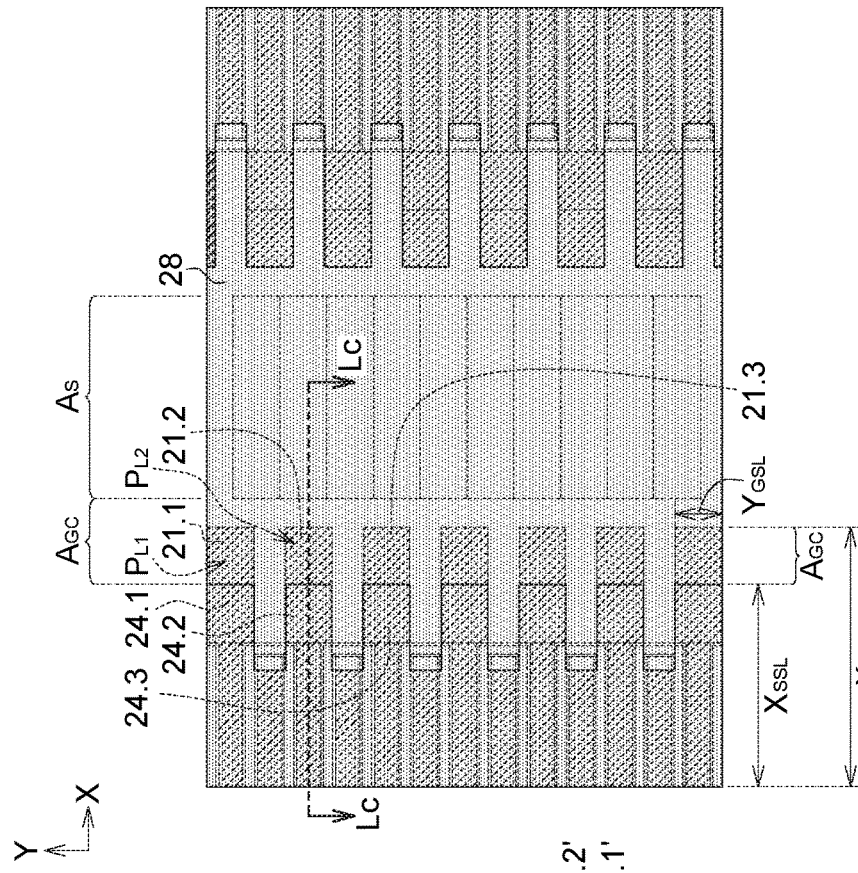
Figure 9B:
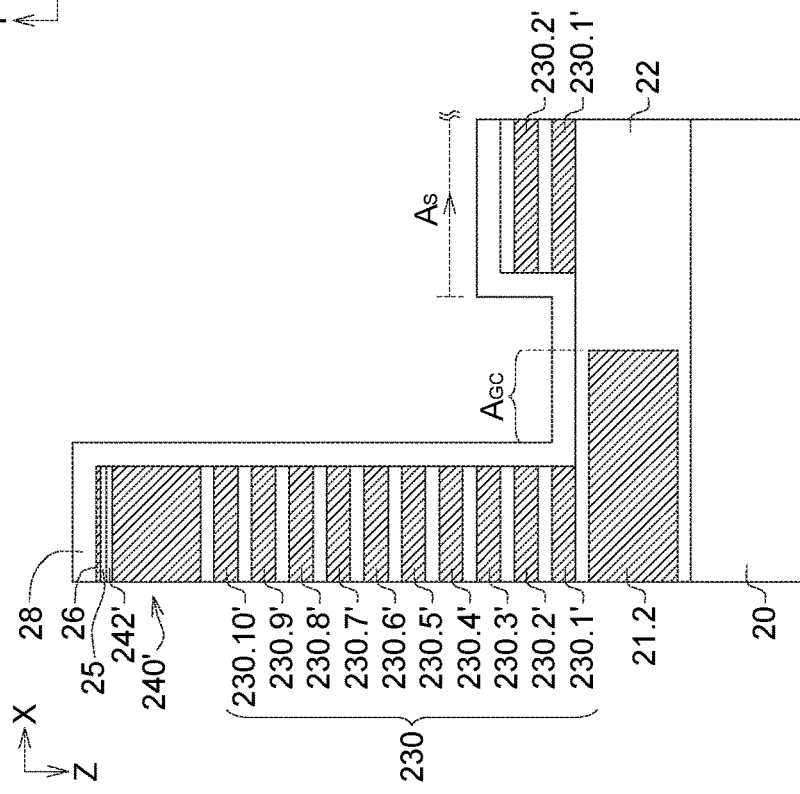

Afterwards, a stairstep arrangement is created in the stairstep landing area $A_S$ (FIG. 1) by the known procedures, followed by deposition of an etch stop layer. Please refer to FIG. 9A and FIG. 9B. FIG. 9A is a top view of a 3D semiconductor device (in a xy-plane) according to the first embodiment of the present disclosure, which illustrate perspective positions of the SSLs, the GSL sections and the stairstep landing area $A_S$. FIG. 9B is a cross-sectional view of the 3D semiconductor device (in a yz-plane) along the cross-sectional line Lc-Lc of FIG. 9A. Also, FIG. 9B shows the second semiconductor layer 230.2' related to the second memory layer (the number increased from the bottom to top). An etch stop layer 27 is formed above the SSLs (such as 24.2 in FIG. 9B) and sidewalls of the stacked structure and further extended to the stairstep landing area $A_S$. The etch stop layer 27 is also formed above the landing platforms (ex: $P_{L1}$, $P_{L2}$, $P_{L3}$, . . . in FIG. 8A) of the GSL sections in the GSL contact region $A_{GC}$ (for landing the corresponding GSL contact conductors as formed subsequently). Material of the etch stop layer 27 could be silicon nitride or other suitable material. As shown in FIG. 9A, the landing platforms (ex: $P_{L1}$, $P_{L2}$, $P_{L3}$, . . . , for landing the GSL contact conductors as formed subsequently) are positioned between a stairstep landing area $A_S$ and the stacked structures.

Please refer to FIG. 10A and FIG. 10B. FIG. 10A is a top view of a 3D semiconductor device (in a xy-plane) according to the first embodiment of the present disclosure, which illustrate perspective positions of the SSL contact conductors, the GSL contact conductors and the stairstep contact conductors. FIG. 10B is a cross-sectional view of the 3D semiconductor device (in a xz-plane) along the cross-sectional line Lc-Lc of FIG. 10A. According to the design of the embodiment, the landing platforms (ex: $P_{L1}$, $P_{L2}$, $P_{L3}$, . . . in FIG. 8A) of the GSL sections in the GSL contact region $A_{GC}$ are created, so that the GSL contact conductors can be landed correspondingly during formation of the SSL contact conductors and the stairstep contact conductors. As shown in FIG. 10A, an insulation 29 (also known as interlayer dielectric layer, ILD) is deposited in the stairstep landing area $A_S$ and also cover the etch stop layer 28 above the SSLs and the landing platforms (ex: $P_{L1}$, $P_{L2}$, $P_{L3}$, . . . in FIG. 8A) of the GSL sections, wherein an upper surface 290 of the insulation 29 is higher than the etch stop layer 28 above the SSLs (ex: SSL 24.2). The insulation 29 can be silicon dioxide, other insulating materials with regard to the insulating layer 232 of the stacked structures, or other suitable materials for a particular embodiment. In one embodiment, the material of the insulation 29 is different from the material of the etch stop layer 28 for the purpose of etching selectivity. Also, the SSL contact conductors 31, the GSL contact conductors 32 and the stairstep contact conductors 33 are formed by extending along a third direction (i.e. Z-direction) and penetrating through at least the insulation 29 and the etch stop layer 28 for achieving their own electrical connection. For example, the SSL contact conductors 31 (such as 31.1-31.7 in FIG. 10A) are electrically connected to the SSLs respectively. The GSL contact conductors 32 (such as 32.1-32.7 in FIG. 10A) are respectively coupled (electrically connected) to the landing platforms of the GSL sections within the GSL contact region $A_{GC}$. In other words, each of the landing platforms is the GSL section protruding outside the stacked structures and outside the SSLs on the stacked structures, as shown in FIG. 10B. Moreover, the stairstep contact conductors 33 (such as 33.1-33.7 in FIG. 10A) are formed within a stairstep landing area and electrically connected to the corresponding semiconductor layers of the memory layers. FIG. 10B shows the stairstep contact conductor 33.2 is electrically connected to the corresponding semiconductor layer 230.2' related to the second memory layer. According to the embodiment, the GSL contact conductors 32 are positioned between the SSL contact conductors 31 and the stairstep contact conductors 33.

Second Embodiment

FIG. 11A-FIG. 20B Illustrate a method for manufacturing a 3D semiconductor device according to the second embodiment of the disclosure. In the second embodiment, the gate-all-around vertical channel (GAAVC) 3D semiconductor device is exemplified for illustration. The process flows of the second and first embodiments are very similar, except for the gate types and the transverse length (ex: $Y_{GSL}$) along the second direction (i.e. Y-direction) of the GSL sections. Accordingly, the identical and/or similar elements of the second and first embodiments are designated with the same and/or similar reference numerals for illustrative purpose.

Figure 11A:
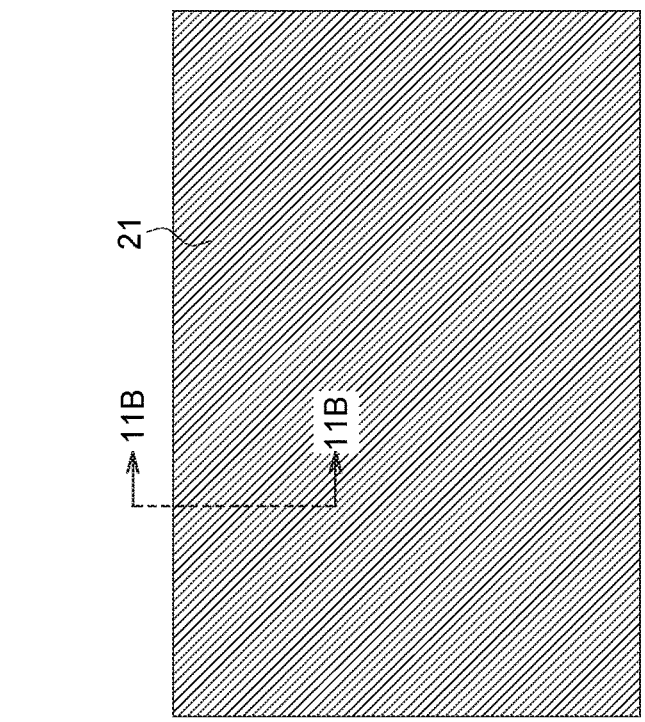
Figure 11B:
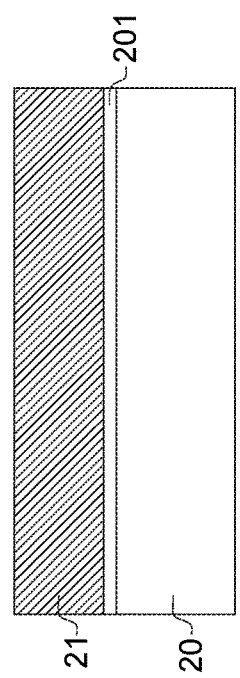

The step as shown in FIG. 11A and FIG. 11B are identical to that in FIG. 2A and FIG. 2B, respectively. As shown in FIG. 11B, a substrate 20 with an insulating surface (can be an insulation film 201 such as an oxide layer) is provided. A first semiconductor layer (such as polysilicon layer) 21 is deposited on the insulating surface of the substrate 20.

Figure 12A:
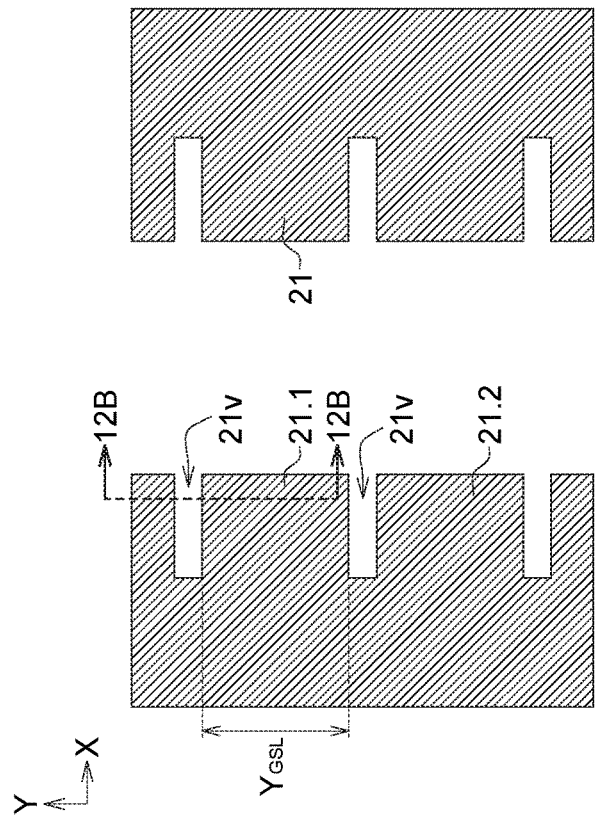
Figure 12B:
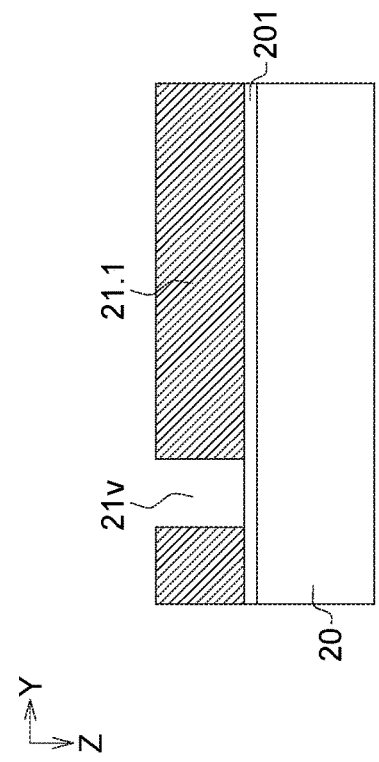

The step as shown in FIG. 12A and FIG. 12B are identical to that in FIG. 3A and FIG. 3B, respectively. As shown in FIG. 12A and FIG. 12B, the first semiconductor layer 21 are patterned (such as by photolithography and etching) to form a plurality of ground selection line (GSL) sections (ex: the GSL sections 21.1 and 21.2) separately on the substrate 20 (i.e. electrically insulated from each other) and the spaces 21v between the adjacent GSL sections. Also, a first transverse length $Y_{GSL}$ along the second direction (i.e. Y-direction) of each GSL section is defined. The transverse length (ex: $Y_{GSL}$) along Y-direction of the GSL section in the second embodiment (FIG. 12A) is larger than that in the first embodiment (FIG. 3A).

Figure 13A:
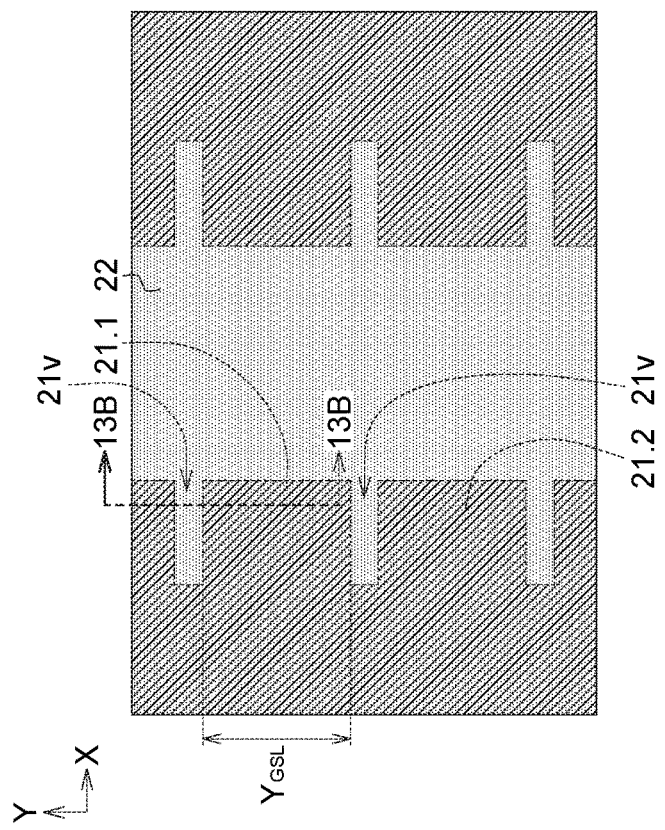
Figure 13B:
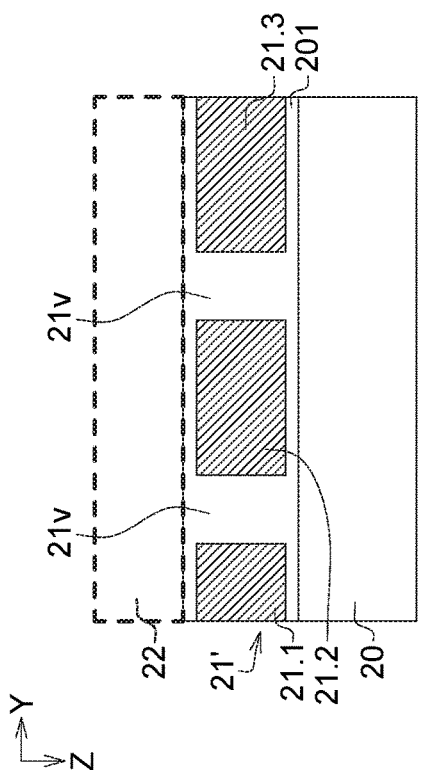

After forming the separate GSL sections, an insulating layer 22 is deposited on the GSL sections (ex: 21.1/21.2) to fill the spaces 21v between the adjacent GSL sections, followed by planarization (such as chemical mechanical polishing, CMP), as shown in FIG. 13A and FIG. 13B (which are identical to the step in FIG. 4A and FIG. 4B).

Step as shown in FIG. 14A and FIG. 14B, including forming the alternated second semiconductor layers 230 (including 230.1 to 230.10), 240 and the insulating layers 232 (including 232.0-232.10) and 242, are identical to that in FIG. 5A and FIG. 5B, respectively.

Please refer to FIG. 15A and FIG. 15B. FIG. 15A is a top view of a 3D semiconductor device (in a xy-plane) according to the second embodiment of the present disclosure, which shows array pattern of the multi-layers. FIG. 15B is a cross-sectional view of the 3D semiconductor device (in a yz-plane) along the cross-sectional line 15B-15B of FIG. 15A. As shown in FIG. 15A and FIG. 15B, a plurality of vertical channel columns, such as Vcc1-Vcc4, are formed (such as by photolithography and etching) to expose the substrate 20.

Figures 17A, 17B:
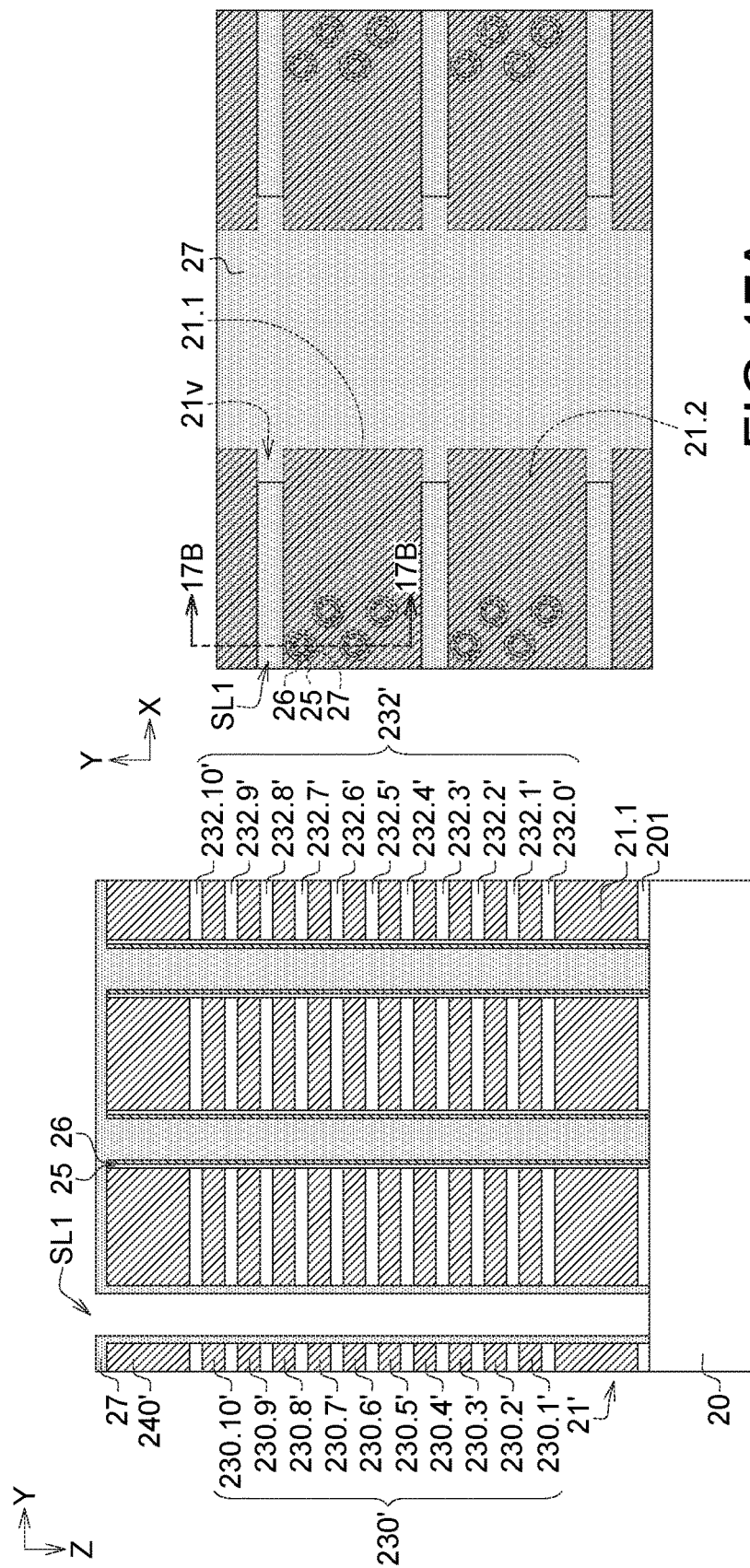

Step as shown in FIG. 16A and FIG. 16B are similar to that in FIG. 7A and FIG. 7B, respectively. As shown in FIG. 16A and FIG. 16B, the ONO layers (as the charge trapping layer) 25 is formed in the vertical channel columns (such as Vcc1-Vcc4), the channel conductors 26 (such as polysilicon) is formed at the sidewalls of the ONO layers 25, and a dielectric layer 27 (such as oxide) is formed to fill the gaps in the vertical channel columns and also cover the ONO layers 25, the channel conductors 26 and SSLs, followed by planarization (such as CMP). Afterwards, several slits (such as SL1-SL3) are formed by photolithography and etching to determine the size of the memory page, as shown in FIG. 17A and FIG. 17B.

FIG. 18A and FIG. 18B shows perspective positions of the SSLs and GSL sections after SSL patterning procedure. After SSL patterning procedure (ex: photolithography and etching), the transverse lengths and the longitudinal lengths of the corresponding SSL (24.1/24.2) and the GSL section (21.1/21.2) are defined. As shown in FIG. 18A and FIG. 18B, the GSL section (such as GSL section 21.2) in each memory page has a first longitudinal length $X_{GSL}$ along the first direction (X-direction) and a first transverse length $Y_{GSL}$ along the second direction (Y-direction), and the SSL (such as 24.2) has a second longitudinal length $X_{SSL}$ along the first direction (X-direction) and a second transverse length $Y_{SSL}$ along the second direction (Y-direction), wherein $X_{GSL} > X_{SSL}$, so as to create a landing platform of the GSL section within the GSL contact region $A_{GC}$.

Figures 19A, 19B:
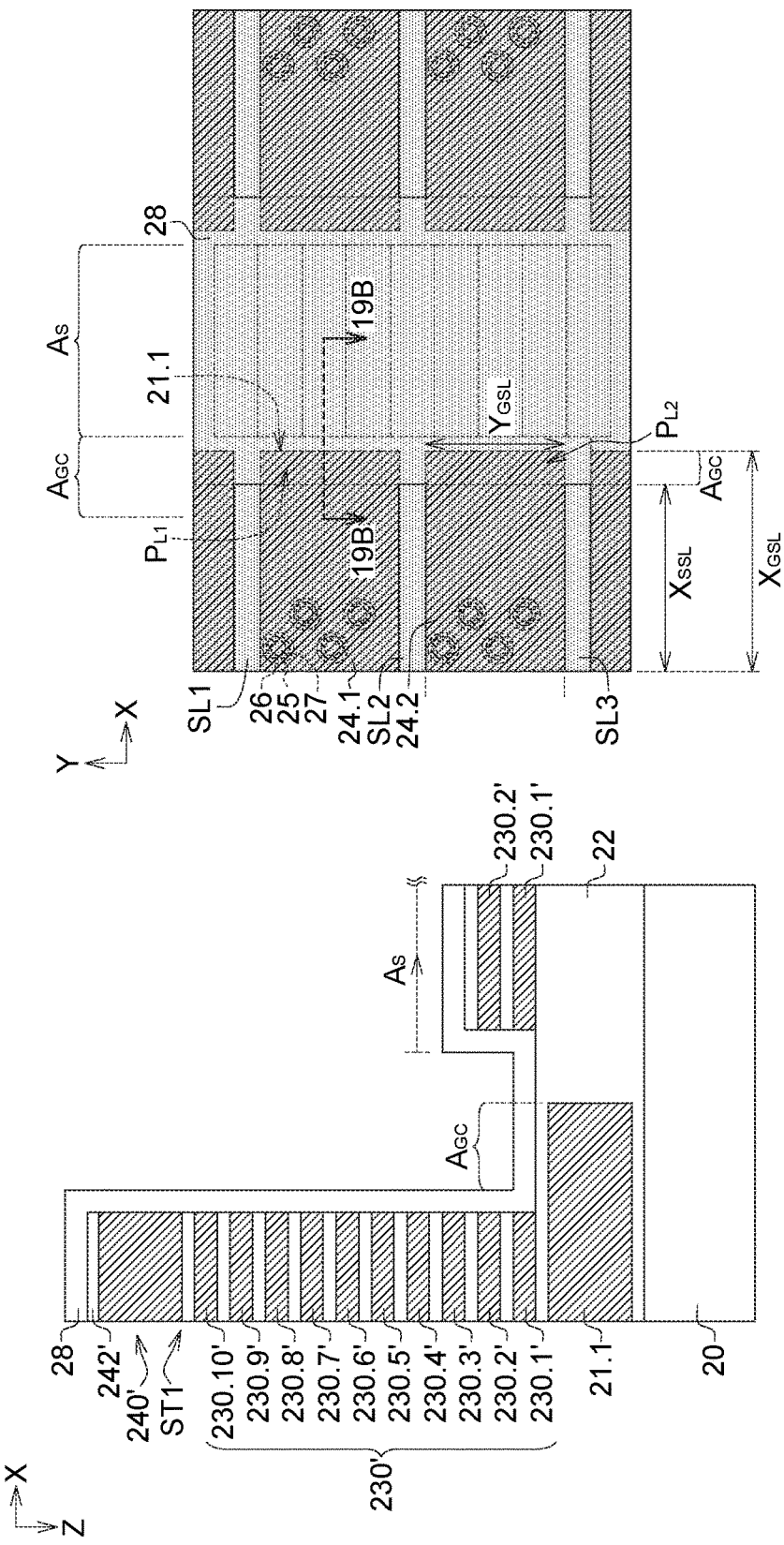

Step as shown in FIG. 19A and FIG. 19B are similar to that in FIG. 9A and FIG. 9B, respectively. A stairstep arrangement is created in the stairstep landing area $A_S$, followed by deposition of an etch stop layer 27. The etch stop layer 27 is also formed above the landing platforms (ex: $P_{L1}$, $P_{L2}$) of the GSL sections in the GSL contact region $A_{GC}$. As shown in FIG. 19A, the landing platforms (ex: $P_{L1}$, $P_{L2}$, for landing the GSL contact conductors as formed subsequently) in the GSL contact region $A_{GC}$ are positioned between a stairstep landing area $A_S$ and the vertical channel columns (such as Vcc1-Vcc4) structures.

Step as shown in FIG. 20A and FIG. 20B are similar to that in FIG. 10A and FIG. 10B, respectively. As shown in FIG. 20A, an insulation 29 (also known as interlayer dielectric layer, ILD) is deposited in the stairstep landing area $A_S$ and also cover the etch stop layer 28 above the SSLs and the landing platforms (ex: $P_{L1}$, $P_{L2}$) of the GSL sections, wherein an upper surface 290 of the insulation 29 is higher than the etch stop layer 28 above the SSLs (ex: SSL 24.1). Also, the SSL contact conductors (such as 31.1 and 31.2) are electrically connected to the SSLs respectively. The GSL contact conductors (such as 32.1 and 32.2) are respectively coupled (electrically connected) to the landing platforms of the GSL sections within the GSL contact region $A_{GC}$. The stairstep contact conductors (such as 33.1-33.9) are formed within the stairstep landing area $A_S$ and electrically connected to the corresponding semiconductor layers of the memory layers. FIG. 20B shows the stairstep contact conductor 33.3 is electrically connected to the corresponding semiconductor layer 230.3' related to the third memory layer.

According to the first embodiment, the SSL contact conductor 31 and the GSL contact conductor 32 in each of memory pages are arranged substantially along the first direction (X-direction). According to the second embodiment, the SSL contact conductor (such as 31.1), the GSL contact conductor (such as 32.1) and the stairstep contact conductor (such as 33.3) in each memory page are arranged substantially along the first direction (X-direction). However, the disclosure is not limited to those arrangements. Positions of those conductors (31-33) can be varied as long as the contact landing purpose can be successfully achieved; for example, the GSL contact conductors are able to land on the landing platforms of the GSL sections within the GSL contact region $A_{GC}$.

According to the aforementioned embodiments, the ground selection line (GSL) sections are separately formed on the substrate before forming the stacked structures, and the GSL sections are electrically insulated from each other. Therefore, the GSL sections can be independently controlled during operation, such as independently applying different bias based on the requirements of applications, so that the reading disturbance between the memory pages can be efficiently suppressed, thereby significantly improving the performance of the 3D semiconductor device.

It is noted that the devices and cell arrays as described above are provided for illustration. The disclosure is not limited to the configurations disclosed above, and the exemplified structures could be adjusted and changed based on the actual needs of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
    a plurality of ground selection line (GSL) sections separately formed on a substrate, the GSL sections being electrically insulated from each other and extended in parallel to each other, and the GSL sections extending along a first direction, wherein the GSL sections comprise a plurality of odd-numbered GSL sections forming a finger structure and a plurality of even-numbered GSL sections forming a finger structure, and the odd-numbered GSL sections are interlaced with the even-numbered GSL sections;
    a plurality of stacked structures vertically formed on the GSL sections, and each stacked structure comprising alternated semiconductor layers and insulating layers;
    a plurality of string selection lines (SSLs) separately formed on the stacked structures, and the string selection lines extending along the first direction; and
    a plurality of bit lines disposed above the SSLs and extending along a second direction, the bit lines arranged parallel to each other and in perpendicular to the SSLs and GSL sections, wherein a plurality of memory cells of memory layers are respectively defined by the stacked structures, the SSLs, the GSL sections and the bit lines correspondingly, and a plurality of memory pages respectively correspond to the memory cells associated with one of the GSL sections.

2. The device according to claim 1, further comprising:
    a plurality of GSL contact conductors formed within a GSL contact region and electrically connected to the GSL sections respectively.

3. The device according to claim 2, wherein in each of the memory pages, a longitudinal length of the GSL section along the first direction is greater than a longitudinal length of the SSL along the first direction so as to create a landing platform within the GSL contact region, and each of the GSL contact conductor is electrically connected to the landing platform of the correspondingly GSL section.

4. The device according to claim 3, wherein the landing platforms for landing the corresponding GSL contact conductors are parts of the GSL sections protruding outside the stacked structures and outside the SSLs on the stacked structures.

5. The device according to claim 3, wherein the landing platforms for landing the GSL contact conductors are positioned between a stairstep landing area and the stacked structures.

6. The device according to claim 2, further comprising:
    a plurality of SSL contact conductors electrically connected to the SSLs respectively; and
    a plurality of stairstep contact conductors formed within a stairstep landing area and respectively coupled to the semiconductor layers of the corresponding memory layers.

7. The device according to claim 6, wherein the SSL contact conductors, the GSL contact conductors and the stairstep contact conductors are extended along a third direction, and the third direction is vertical to a plane determined by the first direction and the second direction.

8. The device according to claim 6, wherein an etch stop layer is formed above the SSLs and sidewalls of the stacked structure and further extended to the stairstep landing area, the etch stop layer is also formed above a landing platform of the GSL section for landing the corresponding GSL contact conductor.

9. The device according to claim 8, further comprising an insulation deposited in the stairstep landing area and also cover the etch stop layer above the SSLs and the landing platforms of the GSL sections, wherein an upper surface of the insulation is higher than the etch stop layer above the SSLs, and the SSL contact conductors, the GSL contact conductors and the stairstep contact conductors penetrate through at least the insulation and the etch stop layer for coupling to the SSLs, the landing platforms and the corresponding memory layers respectively.

10. The device according to claim 6, wherein the GSL contact conductors are positioned between the SSL contact conductors and the stairstep contact conductors.

11. The device according to claim 6, wherein the SSL contact conductor and the GSL contact conductor in each of the memory pages are arranged along the first direction.

12. The device according to claim 1, wherein one of the GSL sections in each of the memory pages has a first longitudinal length XGSL along the first direction, and one of the SSLs has a second longitudinal length XSSL along the first direction, wherein the first longitudinal length XGSL is larger than the second longitudinal length XSSL to create a landing platform within a GSL contact region, wherein a corresponding GSL contact conductor is electrically connected to the landing platform of the GSL section.

13. The device according to claim 12, wherein said GSL section in each of the memory pages has a first transverse length YGSL along the second direction, and said SSL has a second transverse length YSSL along the second direction, the first transverse length YGSL is equal to the second transverse length YSSL.

14. The device according to claim 12, wherein the first transverse length YGSL of said GSL section is corresponding to a transverse length of each of the memory pages.

15. A method for manufacturing a three-dimensional semiconductor device, comprising:
    providing a substrate with an insulating surface;
    forming a first semiconductor layer on the insulating surface of the substrate;
    patterning the first semiconductor layer to form a plurality of ground selection line (GSL) sections separately on the substrate, wherein the GSL sections are electrically insulated from each other and extend along a first direction, wherein the GSL sections comprise a plurality of even-numbered GSL sections forming a finger structure and a plurality of odd-numbered GSL sections forming a finger structure, and the odd-numbered GSL sections are interlaced with the even-numbered GSL sections;
    forming a plurality of stacked structures vertically on the GSL sections on the substrate and a plurality of string selection lines (SSLs) separately formed on the stacked structures, wherein each stacked structure comprises alternated second semiconductor layers and insulating layers, and the string selection lines extend along the first direction; and
    forming a plurality of bit lines above the SSLs and extending along a second direction, the bit lines arranged parallel to each other and in perpendicular to the SSLs and GSL sections, wherein a plurality of memory cells respectively defined by the stacked structures, the SSLs, the GSL sections and the bit lines correspondingly.

16. The method according to claim 15, further comprising:
forming a plurality of SSL contact conductors to electrically connect the SSLs respectively;
forming a plurality of GSL contact conductors within a GSL contact region, and the GSL contact conductors electrically connecting to the GSL sections respectively; and
forming a plurality of stairstep contact conductors within a stairstep landing area, and the stairstep contact conductors electrically connecting to the second semiconductor layers of the corresponding memory layers.

17. The method according to claim 16, wherein in each of memory pages, a longitudinal length of the GSL section along the first direction is greater than a longitudinal length of the SSL along the first direction so as to create a landing platform within the GSL contact region, and each of the GSL contact conductor is electrically connected to the landing platform of the correspondingly GSL section.

18. The method according to claim 17, wherein the landing platforms for landing the GSL contact conductors as created are positioned between the stairstep landing area and the stacked structures.

19. The method according to claim 16, wherein the SSL contact conductors, the GSL contact conductors and the stairstep contact conductors are formed by extending along a third direction, and the third direction is vertical to a plane determined by the first direction and the second direction.

20. The method according to claim 16, wherein the GSL contact conductors are formed at positions between the SSL contact conductors and the stairstep contact conductors.

* * * * *